(12) United States Patent
Ni et al.

(10) Patent No.: US 11,302,705 B2
(45) Date of Patent: Apr. 12, 2022

(54) SEMICONDUCTOR STRUCTURE AND THE FORMING METHOD THEREOF

(71) Applicant: Winbond Electronics Corp., Taichung (TW)

(72) Inventors: Chih-Jung Ni, Taichung (TW); Chuan-Chi Chou, Hsinchu (TW); Yao-Ting Tsai, Kaohsiung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 104 days.

(21) Appl. No.: 16/555,736

(22) Filed: Aug. 29, 2019

(65) Prior Publication Data

US 2020/0152647 A1    May 14, 2020

(30) Foreign Application Priority Data

Nov. 8, 2018   (TW) .................................. 107139612

(51) Int. Cl.
*H01L 27/11521*   (2017.01)
*H01L 27/11526*   (2017.01)
*G11C 5/06*   (2006.01)

(52) U.S. Cl.
CPC ........ *H01L 27/11521* (2013.01); *G11C 5/063* (2013.01); *H01L 27/11526* (2013.01)

(58) Field of Classification Search
CPC .............................................. H01L 27/11521
See application file for complete search history.

(56) References Cited

U.S. PATENT DOCUMENTS

| | | | |
|---|---|---|---|
| 6,107,171 A | 8/2000 | Tsai | |
| 7,307,008 B2 | 12/2007 | Oh et al. | |
| 2006/0019445 A1* | 1/2006 | Chen | H01L 29/42328 438/257 |
| 2012/0184079 A1 | 7/2012 | Kim et al. | |
| 2016/0163876 A1* | 6/2016 | Wu | H01L 29/42328 257/320 |

(Continued)

FOREIGN PATENT DOCUMENTS

| CN | 102938406 A | 2/2013 |
|---|---|---|
| CN | 104425366 A | 3/2015 |

(Continued)

*Primary Examiner* — Moazzam Hossain
(74) *Attorney, Agent, or Firm* — Muncy, Geissler, Olds & Lowe, P.C.

(57) ABSTRACT

The present invention includes a semiconductor structure having a substrate, a gate structure, and a first spacer. The gate structure includes a floating gate structure, an inter-gate dielectric layer, and a control gate structure. The floating gate structure is disposed on the substrate. The inter-gate dielectric layer is disposed on the floating gate structure. The control gate structure is deposited on the inter-gate dielectric layer and includes an electrode layer, a contact layer and a cap layer. The electrode layer is disposed on the inter-gate dielectric layer. The contact layer is disposed on the electrode layer. The cap layer is disposed on the contact layer. The first spacer is disposed on sidewalls of the control gate structure and covers the electrode layer, the contact layer, and the cap layer. Furthermore, the bottom surface of the first spacer is disposed between the bottom surface and the top surface of the electrode layer.

11 Claims, 11 Drawing Sheets

(56) References Cited

U.S. PATENT DOCUMENTS

2017/0032971 A1* 2/2017 Pan .................... H01L 29/40114
2019/0013322 A1* 1/2019 Tsai .................. H01L 29/66825
2020/0034684 A1* 1/2020 Lin .......................... G06N 3/02

FOREIGN PATENT DOCUMENTS

| KR | 20090001396 A | 1/2009 |
| TW | 200605363 A | 2/2006 |
| TW | 201735266 A | 10/2017 |

* cited by examiner

SEMICONDUCTOR STRUCTURE AND THE FORMING METHOD THEREOF

CROSS-REFERENCE TO RELATED APPLICATIONS

The present application claims priority to Taiwanese Patent Application No. 107139612, filed on Nov. 8, 2018, which is incorporated by reference herein in its entirety.

BACKGROUND OF THE INVENTION

Field of the Invention

The present disclosure relates to a semiconductor structure and a forming method thereof, and particularly to a semiconductor structure for preventing wordline leakage and a forming method thereof.

Description of the Related Art

Semiconductor devices are widely used in various electronic devices, such as personal computers, cell phones, digital cameras and other electronic devices. Semiconductor devices are usually made by sequentially disposed materials of an insulating/dielectric layer, a conductive layer and a semiconductor layer on a semiconductor substrate, and then patterning the different layers of material by lithography to form circuit components and elements on the semiconductor substrate.

Flash memory is a common semiconductor device. In the current flash memory manufacturing process, the drain and common source ends in the cell array area are made from self-aligned contact processes to effectively reduce the surface area of the cell array area. However, today's flash memory manufacturing process has the problem of wordline leakage, which will cause device failure and reduce yield.

BRIEF SUMMARY OF THE INVENTION

The embodiments of the present disclosure include a semiconductor structure having a substrate, a gate structure, and a first spacer. The gate structure includes a floating gate structure, an inter-gate dielectric layer, and a control gate structure. The floating gate structure is disposed on the substrate. The inter-gate dielectric layer is disposed on the floating gate structure. The control gate structure is deposited on the inter-gate dielectric layer and includes an electrode layer, a contact layer and a cap layer. The electrode layer is disposed on the inter-gate dielectric layer. The contact layer is disposed on the electrode layer. The cap layer is disposed on the contact layer. The first spacer is disposed on sidewalls of the control gate structure and covers the electrode layer, the contact layer, and the cap layer. Furthermore, the bottom surface of the first spacer is disposed between the bottom surface and the top surface of the electrode layer.

The embodiments of the present disclosure also relates to a semiconductor forming method, including providing a substrate, forming a gate structure on the substrate, and forming a first spacer on the sidewall of the control gate structure. Forming the gate structure includes forming a floating gate structure on the substrate, forming an inter-gate dielectric layer on the floating gate structure, and forming the control gate structure on the inter-gate dielectric layer, and the control gate structure includes an electrode layer, a contact layer and a cap layer. The electrode layer is formed on the inter-gate dielectric layer. The contact layer is formed on the electrode later. The cap layer is formed on the contact layer. The first spacer covers the electrode layer, the contact layer and the cap layer. Furthermore, the bottom surface of the first spacer is disposed between the bottom surface and the top surface of the electrode layer.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION OF THE INVENTION

Figure 1:
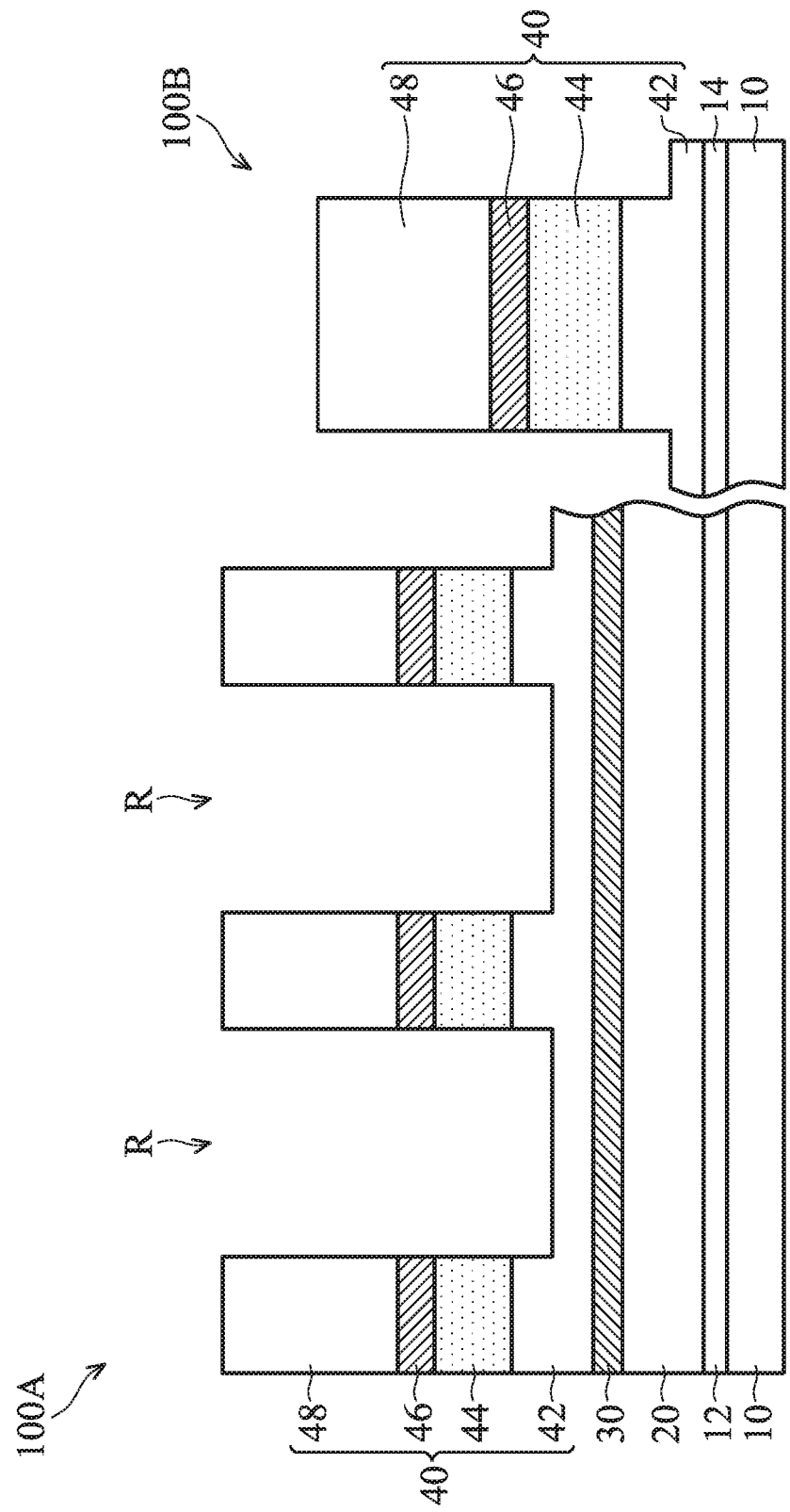
FIGS. 1, 2, 3, 4, 5, 6, 7 and 8A are cross-sectional views of a semiconductor structure in various steps of the manufacturing process thereof, according to some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as, "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

The term "about" as used herein indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

FIGS. 1-8A are cross-sectional views of a semiconductor structure in various steps of the manufacturing process thereof, according to some embodiments of the present disclosure. Referring to FIG. 1, a cross sectional view of an array area 100A and a periphery area 100B according to an embodiment of the present disclosure is provided. The array area 100A includes a substrate 10, a tunneling dielectric layer 12, a floating gate structure 20, an inter-gate dielectric layer 30 and a plurality of control gate structure 40. The periphery area 100B includes the substrate 10, a gate oxide 14 and the control gate structures 40. The control gate structure 40 includes an electrode layer 42, a contact layer 44, a mask layer 46 and a cap layer 48. The control gate structures 40 are separates by recesses R, wherein the recess R extends into the electrode layer 42 but not penetrate the electrode layer 42.

The semiconductor structure may be formed by self-aligned contact process. Details of the self-aligned contact process is that sacrificial polysilicon is deposited between the gates, and then columnar or wall-like patterns are defined by suitable lithography and etching processes. Afterwards, an inter-cell dielectric layer is deposited, and then the sacrificial polysilicon having columnar or wall-like patterns is removed by etching to form circular and ditch-like patterns for forming the semiconductor structure. Self-aligned contact process is a common process in semiconductor industry, so its details are not repeated here.

The substrate 10 may be a semiconductor substrate, such as bulk semiconductor, semiconductor-on-insulator (SOI) substrate, etc., which may be doped (such as doped by p-typed or n-typed dopant) or undoped. The substrate 10 also may be a wafer, such as a silicon wafer. In general, a semiconductor-on-insulator substrate includes a layer of semiconductor material formed on an insulating layer. The insulating layer may be a buried oxide (BOX) layer or a silicon oxide layer, etc. The insulating layer is provided on a substrate (usually a silicon or glass substrate). Other substrates may also be used, such as multi-layered substrates, gradient substrates, hybrid orientation substrates and/or similar substrates. In some embodiments, the material of the substrate 10 may include elemental semiconductors such as silicon or germanium; compound semiconductors including silicon carbide, gallium arsenide, gallium phosphide, indium phosphide, indium arsenide, and/or indium antimonide; alloy semiconductor including SiGe, GaAsP, AlInAs, AlGaAs, GaInAs, GaInP and/or GaInAsP; or a combination thereof.

In some embodiments, the tunneling dielectric layer 12 may include suitable dielectric materials such as oxide. The floating gate structure 20 is formed of conductive materials, such as metal or doped polysilicon, etc. The inter-gate dielectric layer 30 is typically an oxide-nitride-oxide (ONO) film having multilayers. The material of the electrode layer 42 includes conductive materials, such as polysilicon or other suitable conductive materials. The materials of the contact layer 44 include metal silicate, such as tungsten silicate (WSi). The materials of the mask layer 46 include suitable materials for forming a mask, such as amorphous silicon (a-Si), silicon oxide, silicon nitride (SiN), titanium nitride (TiN), silicon oxynitride (SiON), nitrogen silicon carbide (SiCN), other suitable materials or a combination thereof. The material of the cap layer 48 may include dielectric materials, such as silicon nitride, silicon oxynitride, nitrogen silicon carbide, tetraethoxysilane (TEOS) or a combination thereof.

Figure 2:
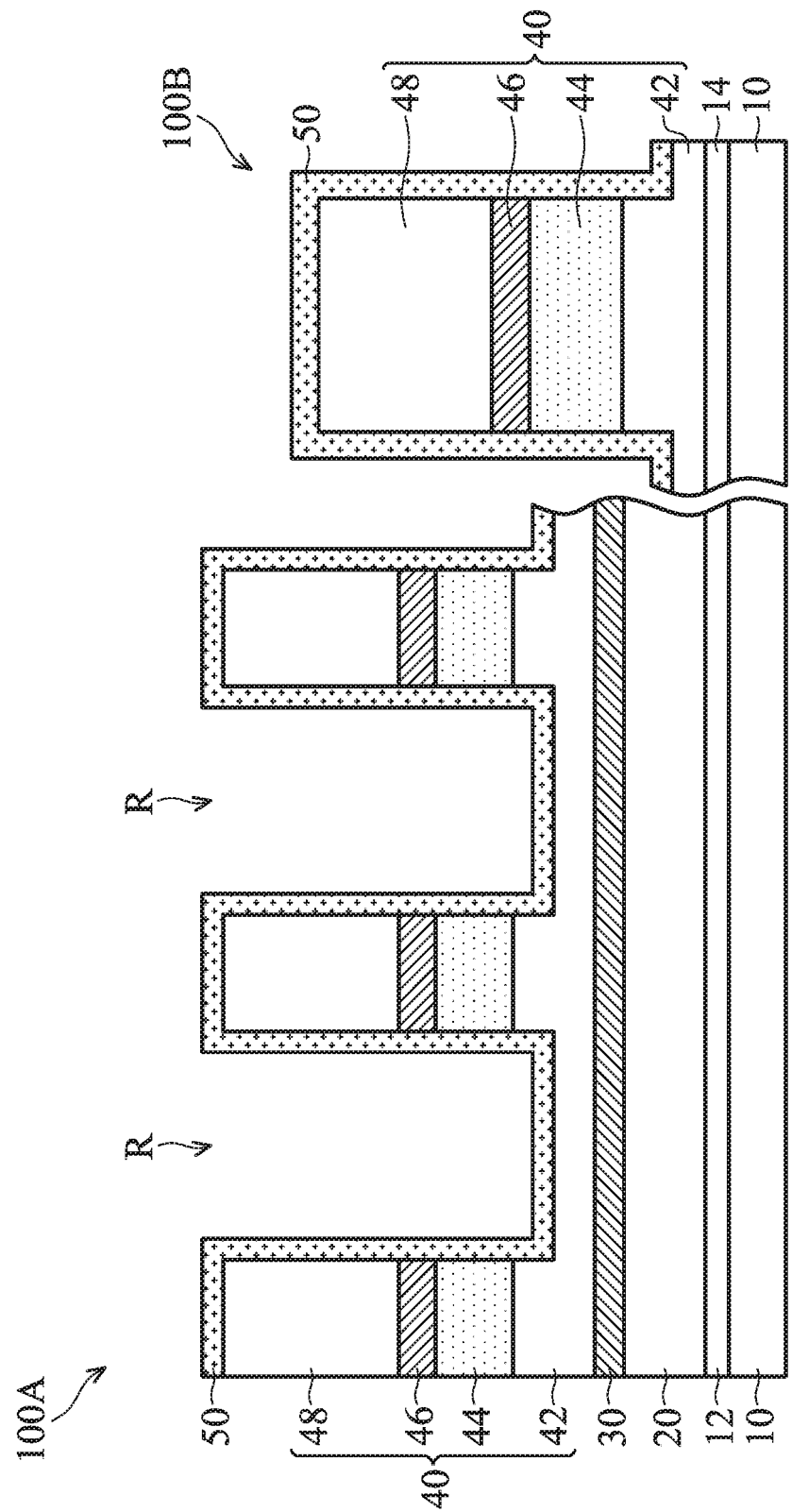

Referring to FIG. 2, a layer of spacer, such as a nitride layer 50, is deposited on the array area 100A and the periphery area 100B of the semiconductor structure in FIG. 1. In FIG. 2, the nitride layer is conformally deposited on the control gate structure 40 and in the recess R. The material of the nitride layer 50 may be suitable materials containing nitrogen, such as silicon nitride. The process for depositing the nitride layer 50 includes suitable chemical vapor deposition (CVD) processes, such as atmospheric pressure CVD (APCVD), low pressure CVD (LPCVD), laser-enhanced CVD (LECVD) and/or plasma enhanced CVD (PECVD).

Figure 3:
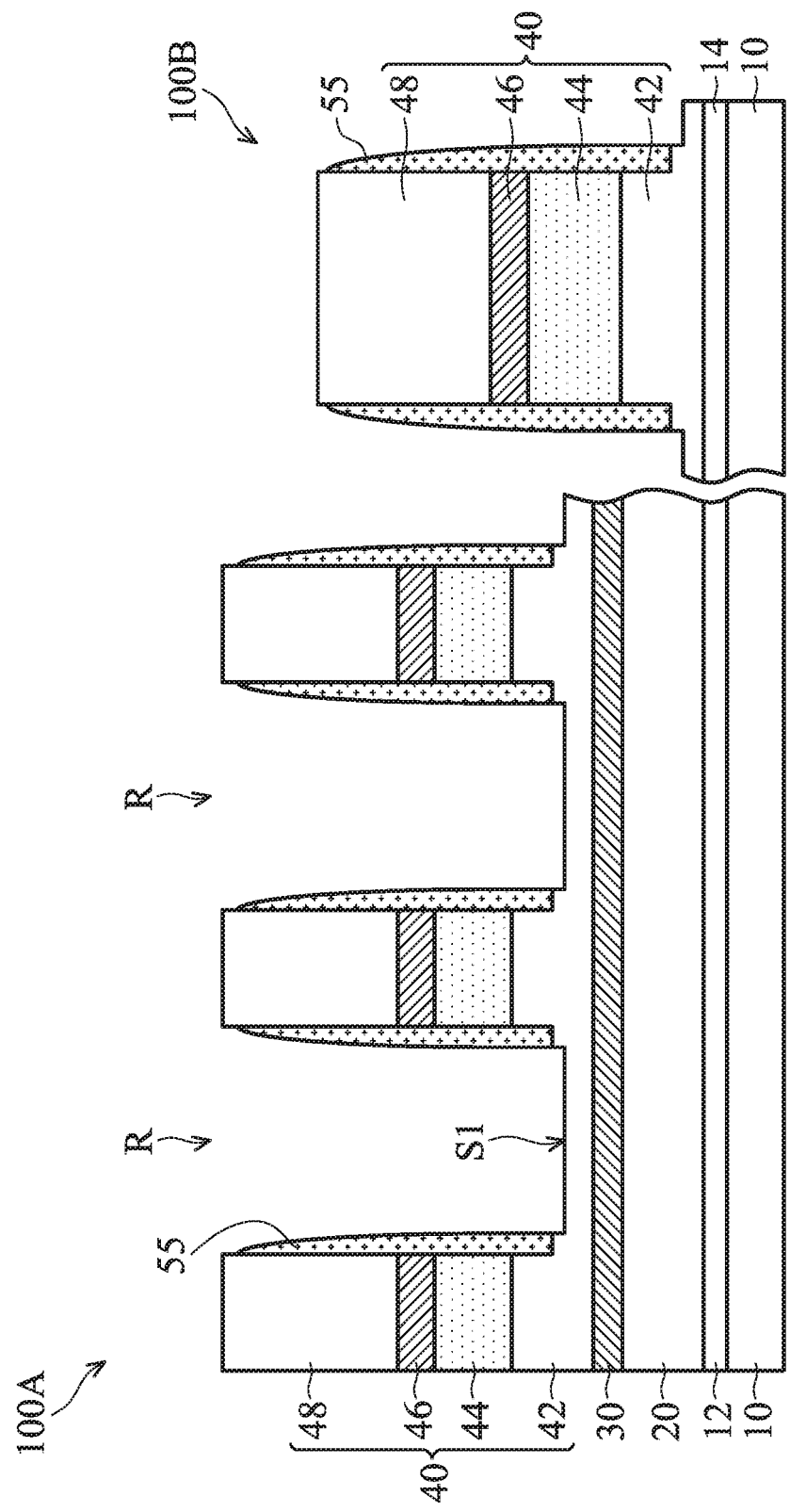

Referring to FIG. 3, a cross sectional view of the semiconductor structure after an etch-back process is performed to the nitride layer 50 is shown. In FIG. 3, etching process is performed to the array area 100A and the periphery area 100B of the semiconductor structure to remove the nitride layer 50 on the top of the control gate structure 40 until the top of the cap layer 48 is exposed. Rest of the nitride layer 50 forms a first spacer 55. The first spacer 55 is disposed on the sidewall of the control gate structure 40, the width of the first spacer 55 is increased from the top (close to the cap layer 48) to the bottom (close to the electrode layer 48) of the control gate structure 40, and the bottom of the first spacer 55 is positioned between the top surface and the bottom surface of the electrode layer 42.

Furthermore, after the etching process, a portion of the electrode layer 42 is exposed. At this moment, the bottom surface of the recess R is the bottom surface S1, and the bottom surface S1 is positioned in the electrode layer 42. It should be noted that the bottom of the first spacer 55 is positioned above the bottom surface S1 of the recess R. The etching process includes suitable etching processes such as reaction ion etching (RIE) or neutral beam etching (NBE), etc., and the etching process may be anisotropic.

Figure 4:
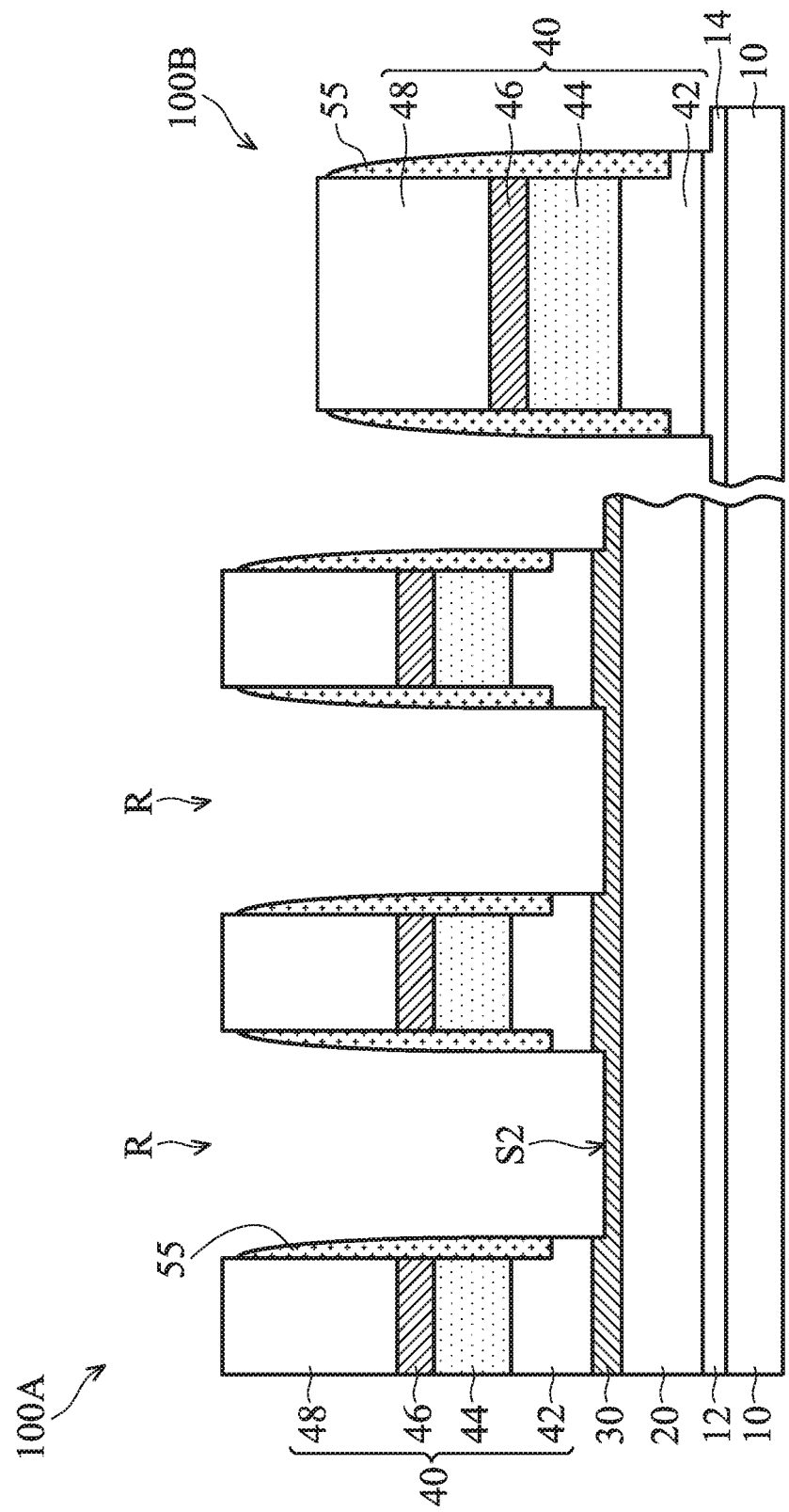

Referring to FIG. 4, the exposed electrode layer 42 is etched in the array area 100A along the recess R, and a portion of the inter-gate dielectric layer 30 is exposed. At this moment, the bottom surface of the recess R is the bottom surface S2 positioned in the inter-gate dielectric layer 30. The electrode layer 42 in the periphery area 100B is also etched to expose a portion of the gate oxide 14. The etching process here may be the same or similar to the etching process if FIG. 3, and is not repeated.

Figure 5:
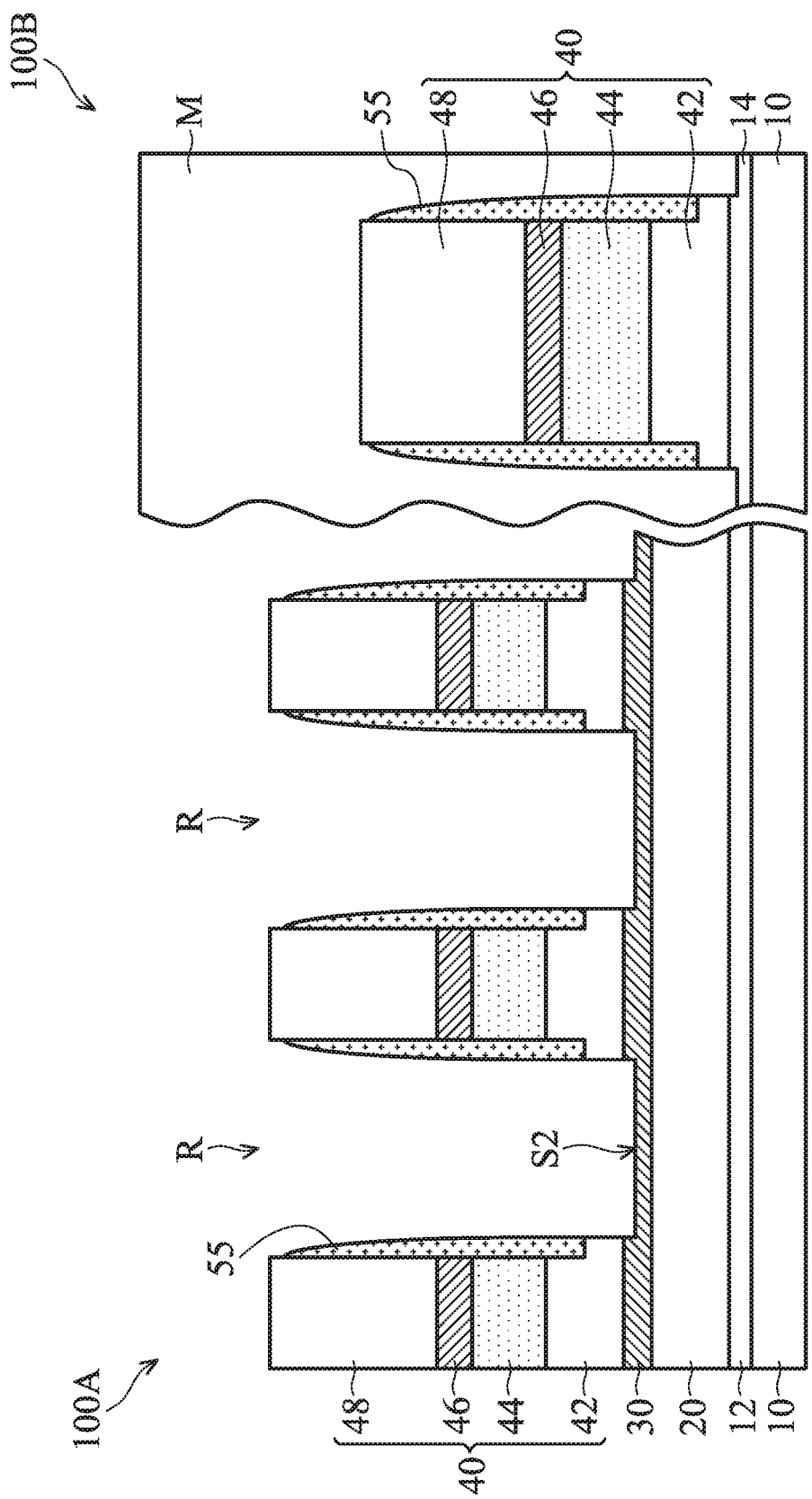

Referring to FIG. 5, a cross-sectional view of the array area 100A and the periphery area 100B of the semiconductor structure after a mask M is disposed on the semiconductor structure is shown. It should be noted that the mask M is only disposed on the periphery area 100B rather than on the array area 100A of the semiconductor structure in FIG. 5. As a result, in subsequent processes, the periphery area 100B may be protected from being affected, and only the array area 100A is affected.

In some embodiments, the mask M may be formed by photoresist materials. In other embodiments, other hard masks that can be selectively removed can also be used, such as $SiO_2$, SiN, etc. Any suitable processes, such as chemical vapor deposition or spin-on processes may be used to form the mask M.

Figure 6:
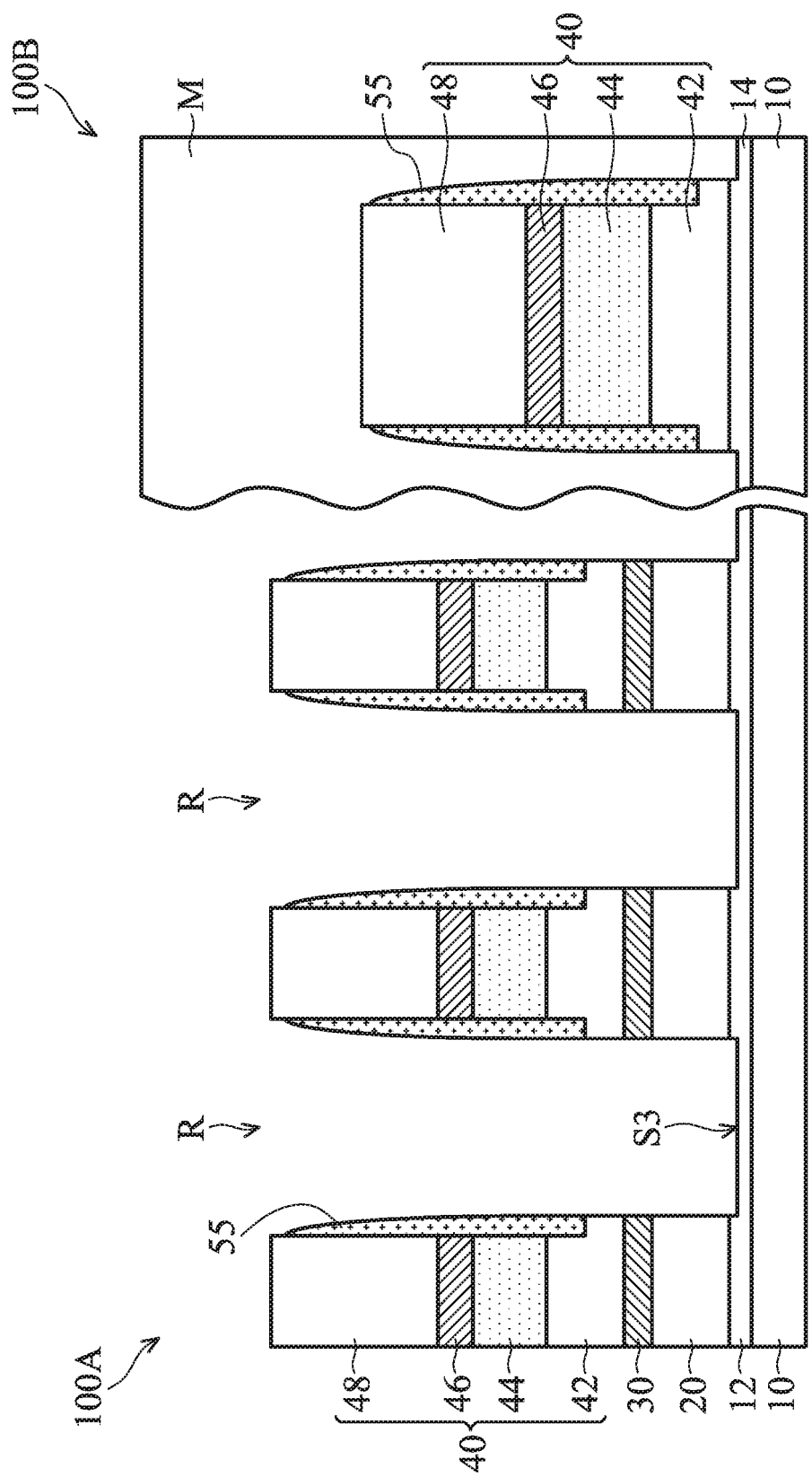

Referring to FIG. 6, a cross-sectional view of the array area 100A and the periphery area 100B of the semiconductor structure after suitable etching process is performed is shown.

In FIG. 6, the floating gate structure 20 and the inter-gate dielectric layer 30 in the recess R are removed, and a portion of the tunneling dielectric layer 12 is exposed. At this moment, the bottom surface of the recess R is the bottom surface S3. As shown in FIG. 6, the bottom surface S3 of the recess R may be slightly lower than the upper surface of the tunneling dielectric layer 12. The etching process here may be, for example, a self-align etching process. Furthermore, the mask M is disposed on the periphery area 100B, so other structures under the mask M are not affected by the etching process and remain the same as the structures of the periphery area 100B shown in FIG. 5B.

Figure 7:
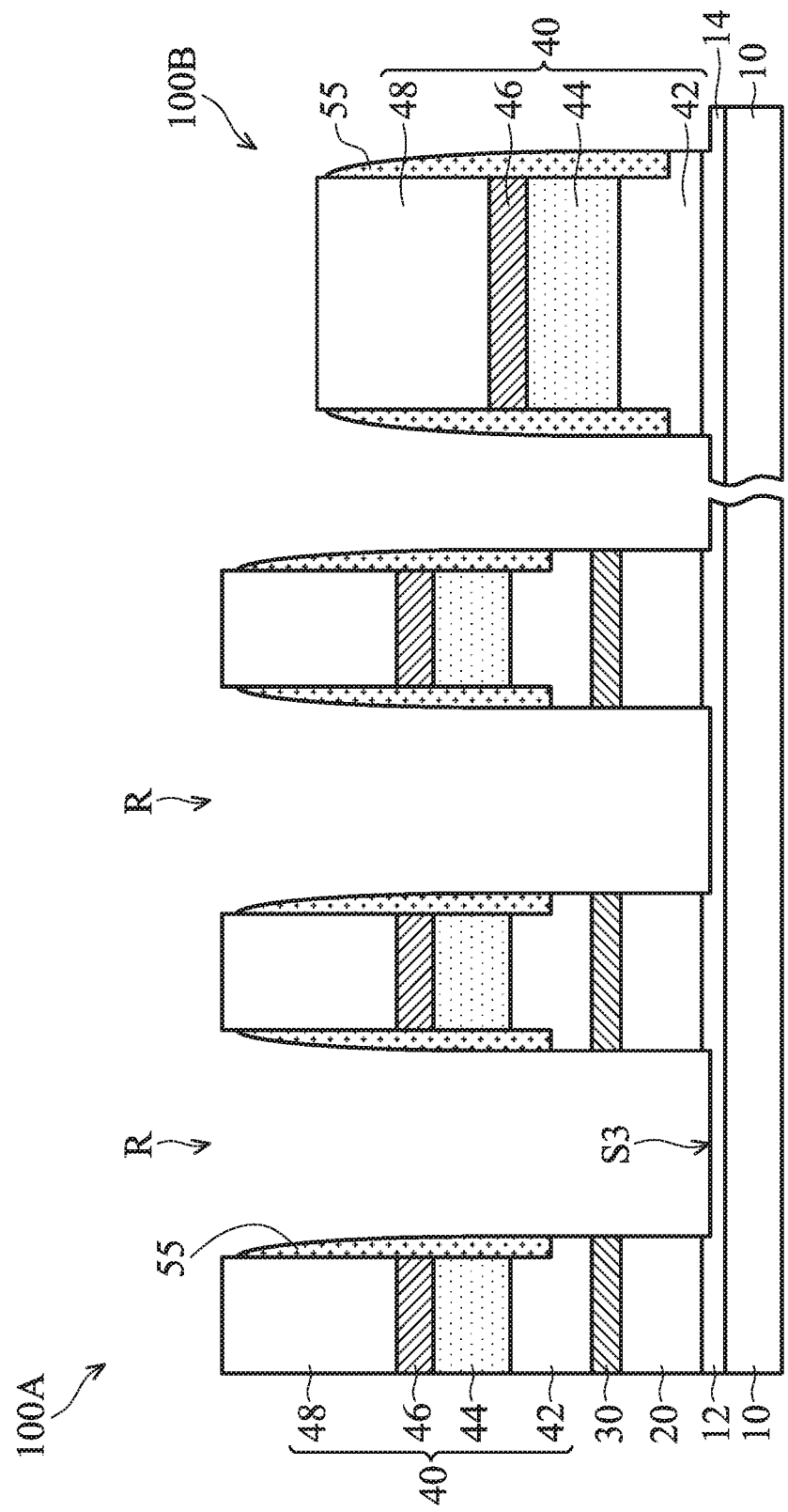

Referring to FIG. 7, a cross-sectional view of the array area 100A and the periphery area 100B of the semiconductor structure after the mask M is removed is shown.

As shown in FIG. 7, after the mask M in FIG. 6 is removed, the floating gate structure 40 and the first spacer 55 in the periphery area 100B are exposed, but the array area 100A is not affected. At this moment, the structure of the array area 100A is the same as the structure of the array area 100A in FIG. 6.

Figure 8A:
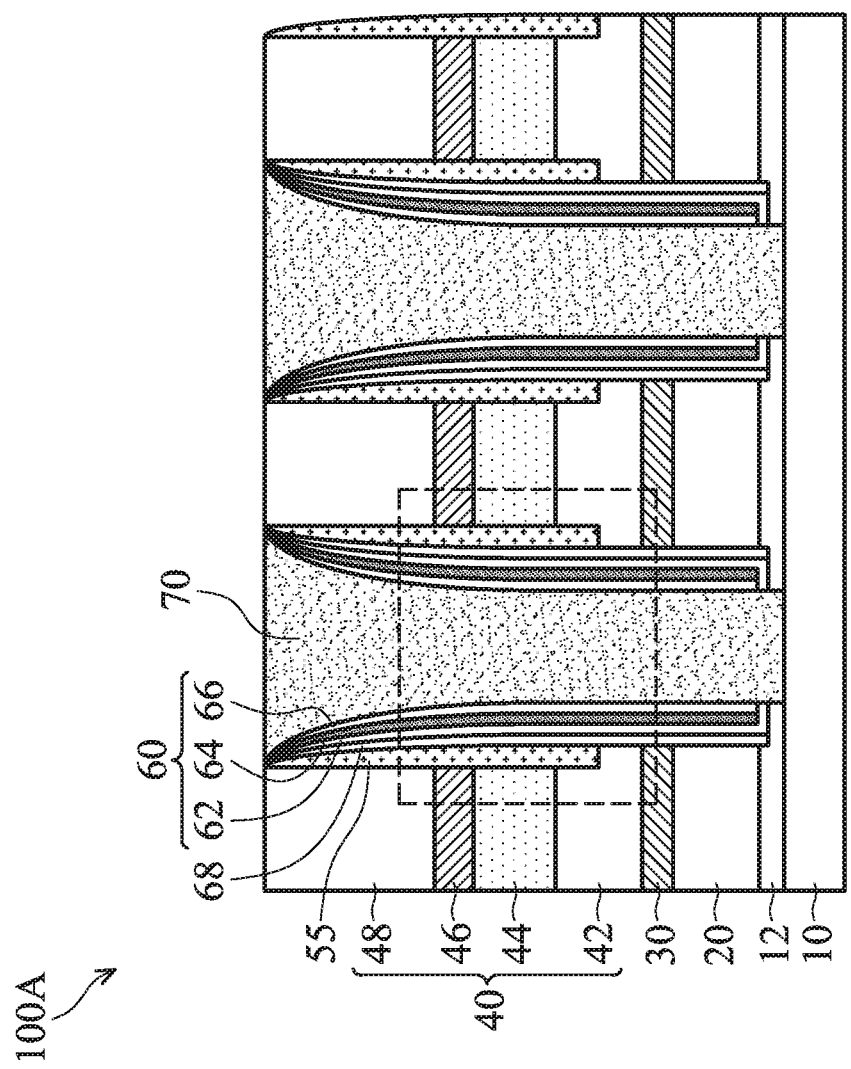

Referring to FIG. 8A, a cross-sectional view of the semiconductor structure after a second spacer 60, a sidewall oxide layer 68 and a contact 70 formed in the recess R of the array area 100A is shown. In some embodiments, the second spacer 60 may be a composite spacer and may include a first oxide layer 62, a nitride layer 64 and a second oxide layer 66. The sidewalls of the first oxide layer 62, the nitride layer 64 and the second oxide layer 66 contact with each other and form a layered structure. It should be noted that the first spacer 55 may be damaged in the aforementioned etching processes, so the sidewall oxide layer 68 may be disposed on the first oxide layer 62 adjacent to the first spacer 55, such as between the first oxide layer 62 and the first spacer 55 or between the first oxide layer 62 and the electrode layer 42, etc., to compensate the damage of the first spacer 55 during the etching process described above. In FIG. 8A, the height of the first oxide layer 62, the nitride layer 64, the second oxide layer 66 and the sidewall oxide layer 68 are substantially the same.

The contact 70 is disposed adjacent to one side of the gate structure 40, and the material of the contact 70 may include suitable conductive materials, such as W, Ti, TiN, etc. The processes to form the second spacer 60 or the sidewall oxide layer 68 may include various suitable deposition, oxidation, etching processes. After the second spacer 60 is formed, suitable conductive material is deposited in the recess R where no second spacer 60 is formed, and then a suitable etch-back or planarization process, such as chemical mechanical planarization (CMP), is performed to form the contact 70.

It should be noted that in FIG. 8A, because the tunneling dielectric layer 12 may be etched through when forming the second spacer 60, the bottom of the contact 70 may extend into the tunneling dielectric layer 12 and contact the substrate to be a source/drain contact.

Figure 8B:
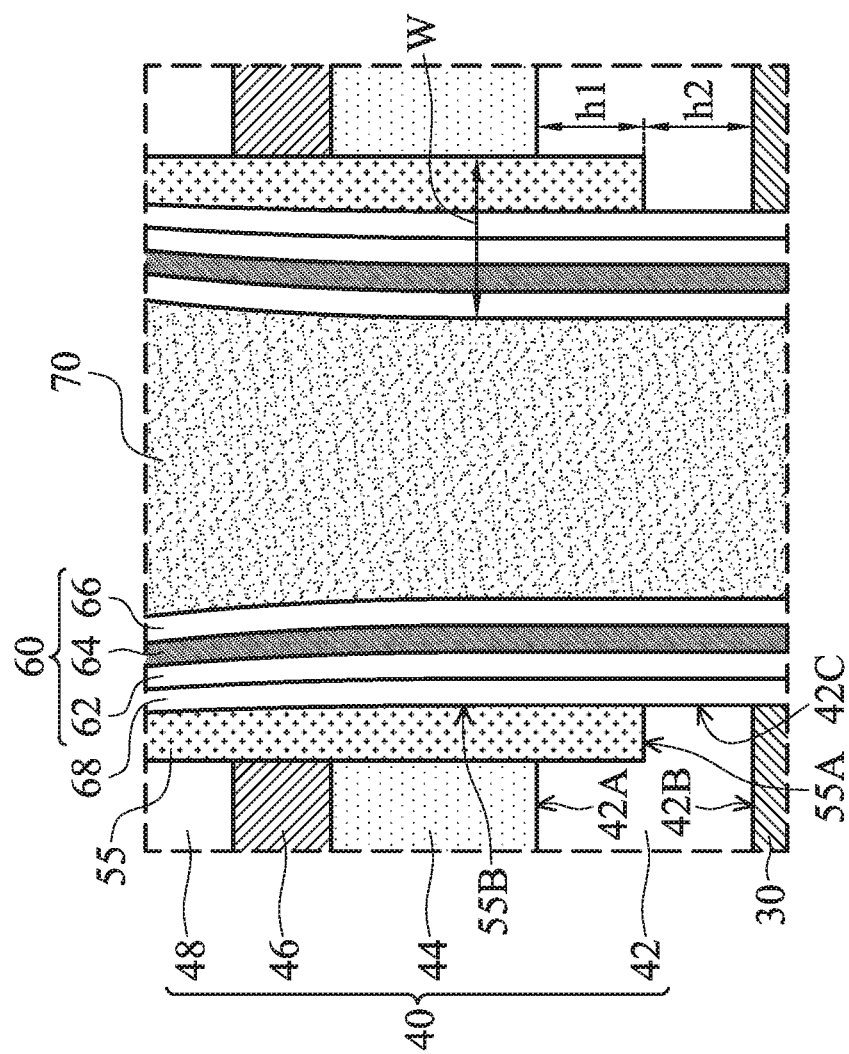
FIG. 8B is an enlarged view of FIG. 8A.

FIG. 8B is an enlarged view of the dashed line portion in FIG. 8A. It should be noted that in FIG. 8B, the bottom surface 55A of the first spacer 55 is positioned between the top surface 42A and the bottom surface 42B of the electrode layer 42. In particular, the distance between the bottom surface 55A of the first spacer 55 and the top surface 42A of the electrode layer 42 is h1, and the distance between the bottom surface 55A of the first spacer 55 and the bottom surface 42B of the electrode layer 42 is h2. In some embodiments, the ratio h1/h2 may be greater than 0.5 and less than 1. In other words, about ⅓ to ½ of the sidewall of the electrode layer 42 is covered by the first spacer 55. As a result, it is ensured that the sidewall of the contact layer 44 on the electrode layer 42 is completely covered by the first spacer 55.

By providing the first spacer 55 between the contact layer 44 and the sidewall oxide layer 68, the contact layer 44 and the sidewall oxide layer 68 may be isolated from each other to prevent the diffusion of elements in the contact layer 44 and the sidewall oxide layer 68, wherein the diffusion forms conductive structure. For example, the contact layer 44 may be prevented from being oxidized in subsequent sidewall oxidization process, wherein the process will form a conductive structure such as $WSi_xO_y$. As a result, the wordline leakage problem may be solved.

Furthermore, the contact layer 44 may be prevented from being oxidized in this configuration, so the volume of the atoms in the contact layer 44 may be prevented from expanding due to oxidation. As a result, the amount of voids or seams created when depositing sacrificial polysilicon may be reduced, thereby decreasing the yield loss due to sacrificial polysilicon residue.

Furthermore, in FIG. 8B, the sidewall oxide layer 68 is in direct contact with the sidewall 42C of the electrode layer 42, and the sidewall 55B of the first spacer 55 and the sidewall 42C of the electrode layer 42 may form a continuous sidewall in direct contact with the sidewall of the sidewall oxide layer 68. It should be noted that the first spacer 55 extends into the electrode layer 42 to make the electrode layer 42 have a step-like sidewall in FIG. 8B. As a result, the contact layer 44 may be protected, and wordline leakage may be prevented.

In other to ensure the insulating between the contact layer 44 and the contact 70, the total width W of the first spacer 55, the second spacer 60 and the sidewall oxide spacer 68 between the contact layer 44 and the contact 70 (the minimum distance between the contact layer 44 and the contact 70) should be greater than a specific value to provide insulating. For example, as shown in FIG. 8B, the total width W of the first spacer 55, the second spacer 60 and the sidewall oxide layer 68 is between 350 Å and 450 Å. As a result, the contact layer 44 and the contact 70 may be prevented from being too close with each other to prevent short circuit or leakage problems.

Figure 9A:
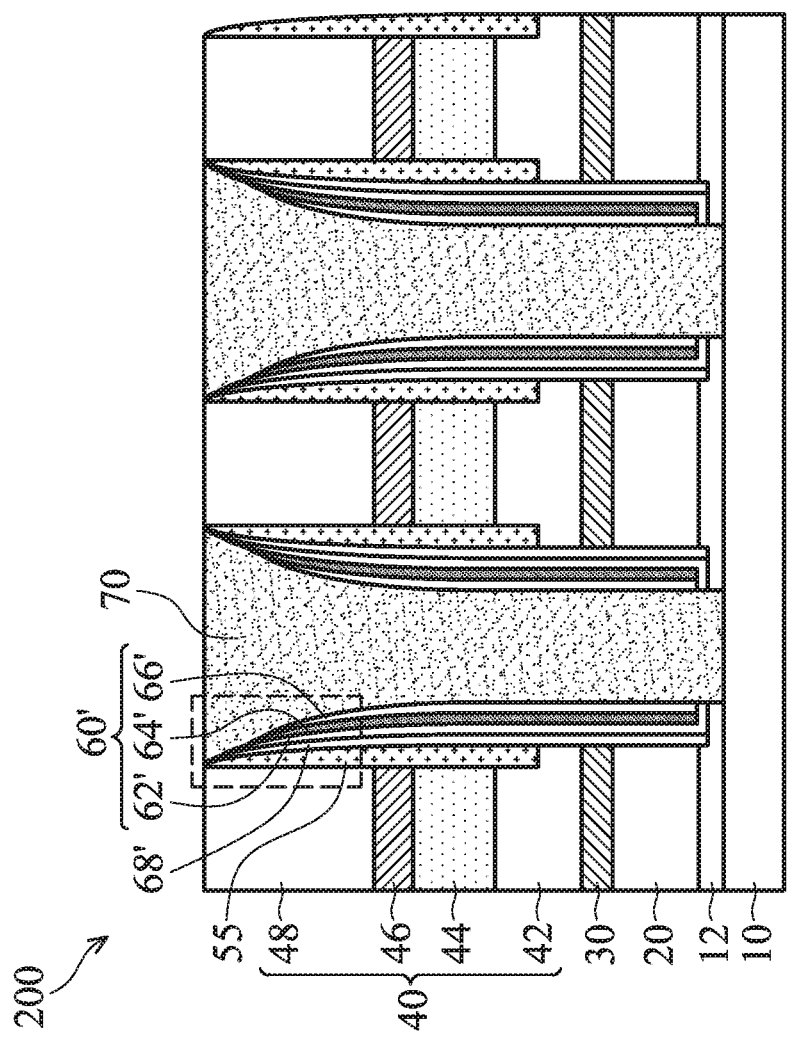
FIG. 9A is a cross-sectional view of a semiconductor structure according to another embodiment of the present disclosure.
Figure 9B:
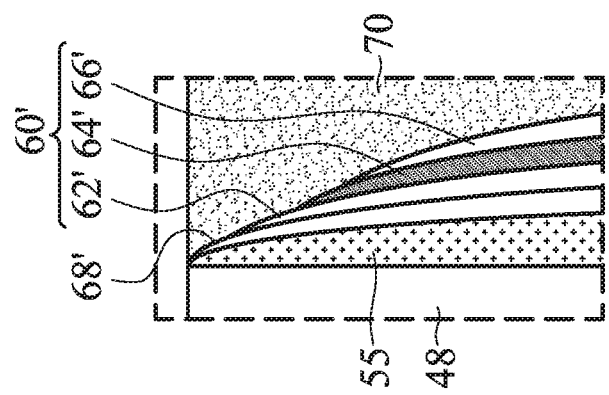
FIG. 9B is an enlarged view of FIG. 9A.

Referring to FIGS. 9A and 9B, a cross-sectional view of an array area 200 of the semiconductor structure according to another embodiment of the present disclosure is shown in FIG. 9A, and FIG. 9B is an enlarged view of the dashed line region in FIG. 9A.

The difference between what is illustrated in FIGS. 9A and 9B and the array area 100A illustrated in FIG. 8A is that the first oxide layer 62', the nitride layer 64' and the second oxide layer 66' in FIG. 9A have different heights. The second spacer 60' of the array area 200 may include the first oxide layer 62', the nitride layer 64' and the second oxide layer 66', wherein the height of the first oxide layer 62' is greater than the height of the nitride layer 64', and the height of the nitride layer 64' is greater than the height of the second oxide layer 66'. Furthermore, in FIG. 9B, the nitride layer 64' is not completely covered by the first oxide layer 62' and the second oxide layer 66', and the top of the nitride layer 64' is exposed from the first oxide layer 62' and the second oxide layer 66' and is in direct contact with the sidewall oxide layer 68'. As a result, the flexibility of the process may be increased.

Figure 10B:
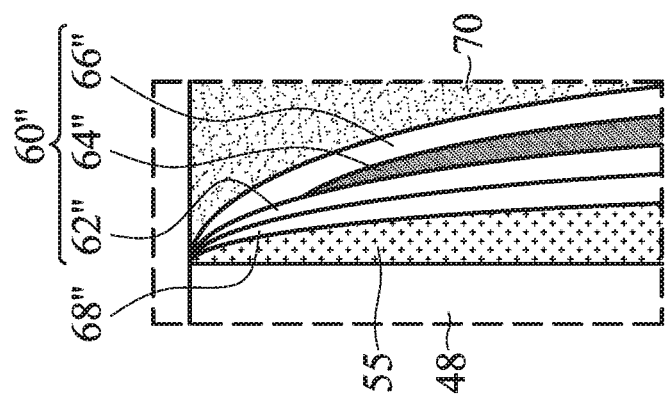
FIG. 10B is an enlarged view of FIG. 10A.
Figure 10A:
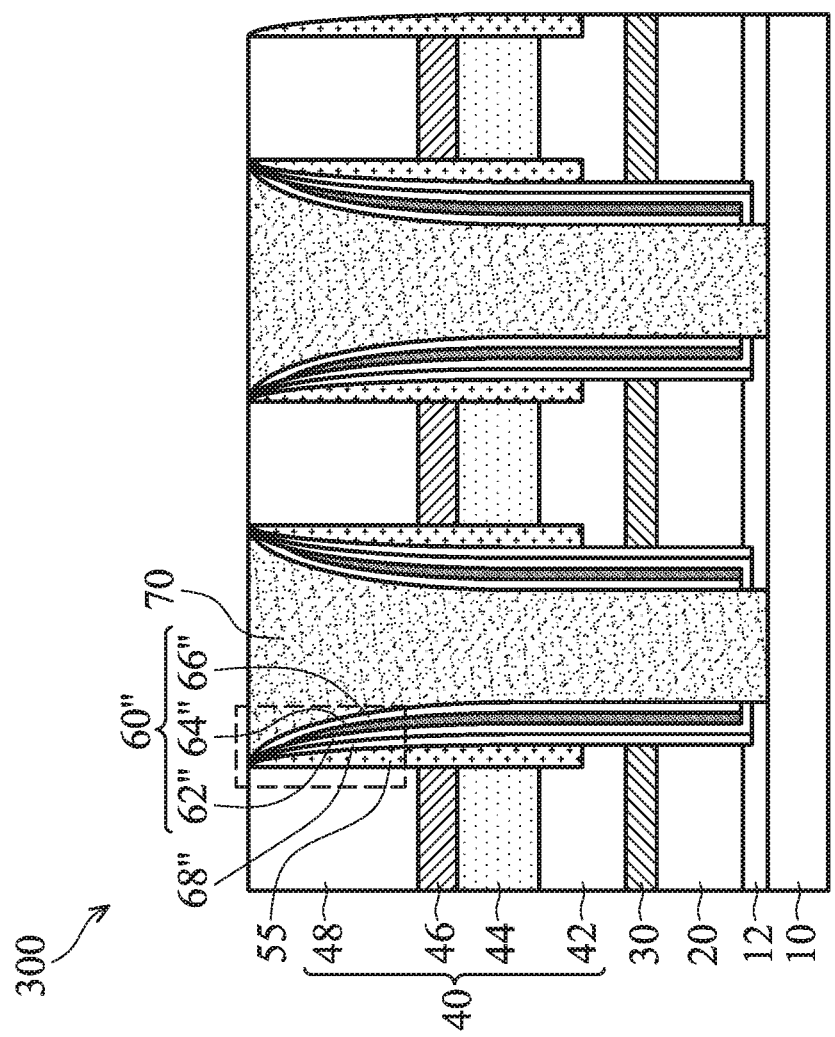
FIG. 10A is a cross-sectional view of a semiconductor structure according to another embodiment of the present disclosure.

Referring to FIGS. 10A and 10B, a cross-sectional view of an array area 300 of the semiconductor structure according to another embodiment of the present disclosure is shown in FIG. 10A, and FIG. 10B is an enlarged view of the dashed line region in FIG. 10A.

The difference between what is illustrated in FIGS. 10A and 10B and the array area 200 illustrated in FIG. 9A is that the second spacer 60" in FIG. 10A may include a first oxide layer 62", a nitride layer 64" and a second oxide layer 66", and the nitride layer 64" is enclosed by the first oxide layer 62" and the second oxide layer 66". In other words, the height of the nitride layer 64" is less than the height of the first oxide layer 62" and that of the second oxide layer 66", and the top of the nitride layer 64" is not exposed from the first oxide layer 62" and the second oxide layer 66". That is, the nitride layer 64" does not come into direct contact with the sidewall oxide layer 68". As a result, the flexibility of the process may be increased.

In summary, a semiconductor structure for preventing wordline leakage and the manufacturing method thereof is provided in the present disclosure. By providing the spacer on the sidewall of the control gate structure, diffusion during manufacturing the semiconductor structure may be avoided to prevent wordline leakage. Furthermore, the amount of voids or seams produced when depositing polysilicon may be reduced, and the yield increased.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope of such processes, machines, manufacture, compositions of matter, means, methods, or steps. In addition, each claim constitutes a separate embodiment, and the combination of various claims and embodiments are within the scope of the disclosure.

What is claimed is:

1. A method for forming a semiconductor structure, comprising:
    providing a substrate;
    forming a gate structure on the substrate, wherein forming the gate structure comprises:
        forming a floating gate structure on the substrate;
        forming an inter-gate dielectric layer on the floating gate structure;
        forming a control gate structure on the inter-gate dielectric layer, wherein the control gate structure comprises:
            an electrode layer formed on the inter-gate dielectric layer;
            a contact layer formed on the electrode layer; and
            a cap layer formed on the contact layer;
        forming a first spacer on a sidewall of the control gate structure, wherein the first spacer covers the electrode layer, the contact layer and the cap layer, and a bottom surface of the first spacer is positioned between a bottom surface and a top surface of the electrode layer; and
        forming a sidewall oxide layer on the sidewall of the gate structure and in direct contact with the electrode layer, wherein the first spacer is disposed between the gate structure and the sidewall oxide layer.

2. The method as claimed in claim 1, further comprising forming a second spacer on the sidewall oxide layer, wherein the second spacer comprises:
    a first oxide layer in direct contact with the sidewall oxide layer;
    a nitride layer disposed on the first oxide layer; and
    a second oxide layer disposed on the nitride layer.

3. The method as claimed in claim 2, further comprising forming a contact in contact with the second spacer and the substrate.

4. The method as claimed in claim 3, wherein the nitride layer is in contact with the contact.

5. The method as claimed in claim 3, wherein the nitride layer is separated from the contact by the first oxide layer and the second oxide layer.

6. The method as claimed in claim 2, further comprising forming a tunneling dielectric layer between the substrate and the gate structure, wherein the second spacer is separated from the substrate by the tunneling dielectric layer.

7. The method as claimed in claim 6, wherein the nitride layer is separated from the tunneling dielectric layer by the first oxide layer.

8. The method as claimed in claim 2, wherein the second spacer is in contact with the inter-gate dielectric layer.

9. The method as claimed in claim 1, wherein the bottom surface of the first spacer is in contact with the electrode layer.

10. The method as claimed in claim 1, wherein the first spacer is separated from the inter-gate dielectric layer.

11. The method as claimed in claim 1, further comprising forming a mask layer between the cap layer and the contact layer.

* * * * *